(12) United States Patent
Maayan (10) Patent No.: US 7,599,227 B2
(45) Date of Patent: *Oct. 6, 2009

(54) REDUCED POWER PROGRAMMING OF NON-VOLATILE CELLS

(75) Inventor: Eduardo Maayan, Kfar Saba (IL)

(73) Assignee: Saifun Semiconductors Ltd., Netanya (IL)

( * ) Notice: Subject to any disclaimer, the term of this patent is extended or adjusted under 35 U.S.C. 154(b) by 0 days.

This patent is subject to a terminal disclaimer.

(21) Appl. No.: 12/081,282

(22) Filed: Apr. 14, 2008

(65) Prior Publication Data

US 2008/0198670 A1   Aug. 21, 2008

Related U.S. Application Data

(63) Continuation of application No. 10/864,500, filed on Jun. 10, 2004, now Pat. No. 7,366,025.

(51) Int. Cl.
*G11C 16/04* (2006.01)
(52) U.S. Cl. .............................. 365/185.28; 365/185.13
(58) Field of Classification Search ............. 365/185.28
See application file for complete search history.

(56) References Cited

U.S. PATENT DOCUMENTS

| 4,818,900 | A | * | 4/1989 | Klass et al. ............ 365/185.23 |
|---|---|---|---|---|
| 5,043,941 | A | * | 8/1991 | Sakamoto ................ 365/185.1 |
| 5,686,745 | A | * | 11/1997 | Lin et al. .................... 257/295 |
| 5,793,679 | A | * | 8/1998 | Caser et al. ............ 365/185.27 |
| 5,844,404 | A | * | 12/1998 | Caser et al. ................ 323/314 |
| 6,078,521 | A | * | 6/2000 | Madurawe et al. ..... 365/185.27 |
| 6,172,397 | B1 | * | 1/2001 | Oonakado et al. ........... 257/321 |
| 6,282,145 | B1 | * | 8/2001 | Tran et al. .............. 365/230.06 |
| 6,574,152 | B1 | * | 6/2003 | Lee et al. ............... 365/189.11 |
| 6,614,692 | B2 | | 9/2003 | Eliyahu et al. |
| 6,633,496 | B2 | | 10/2003 | Maayan et al. |
| 6,856,551 | B2 | * | 2/2005 | Mokhlesi et al. ........ 365/185.28 |
| 7,366,025 | B2 | * | 4/2008 | Maayan ................ 365/185.28 |
| 2003/0058728 | A1 | * | 3/2003 | Tran et al. .............. 365/230.03 |
| 2003/0145176 | A1 | | 7/2003 | Dvir et al. |
| 2005/0276118 | A1 | | 12/2005 | Maayan |

* cited by examiner

*Primary Examiner*—Son L Mai
(74) *Attorney, Agent, or Firm*—EMPK & Shiloh, LLP (57) ABSTRACT

Methods for minimizing current consumption in a memory array during programming of non-volatile memory cells, such as NROM cells, in the array include: programming a cell without having a direct current flowing from a positive supply to ground through the array, programming a plurality of cells with programming pulses without discharging a global bit line carrying a programming voltage between programming pulses, and programming a cell with transient currents.

22 Claims, 11 Drawing Sheets

REDUCED POWER PROGRAMMING OF NON-VOLATILE CELLS

RELATED APPLICATIONS

The present application is a continuation of U.S. application Ser. No. 10/864,500, which was filed in the U.S. Patent and Trademark Office on Jun. 10, 2004 now U.S. Pat. No. 7,366,025. The disclosures of all these applications, including all appendixes thereof, are incorporated herein by reference—

FIELD OF THE INVENTION

The present invention relates to non-volatile cells generally and to methods of programming them in particular.

BACKGROUND OF THE INVENTION

Non-volatile memory cells are known in the art, as are nitride read only memory (NROM) cells, which store two bits per cell. A memory chip typically includes an array of these cells, with each bit of each cell being individually accessible.

Figure 1A:
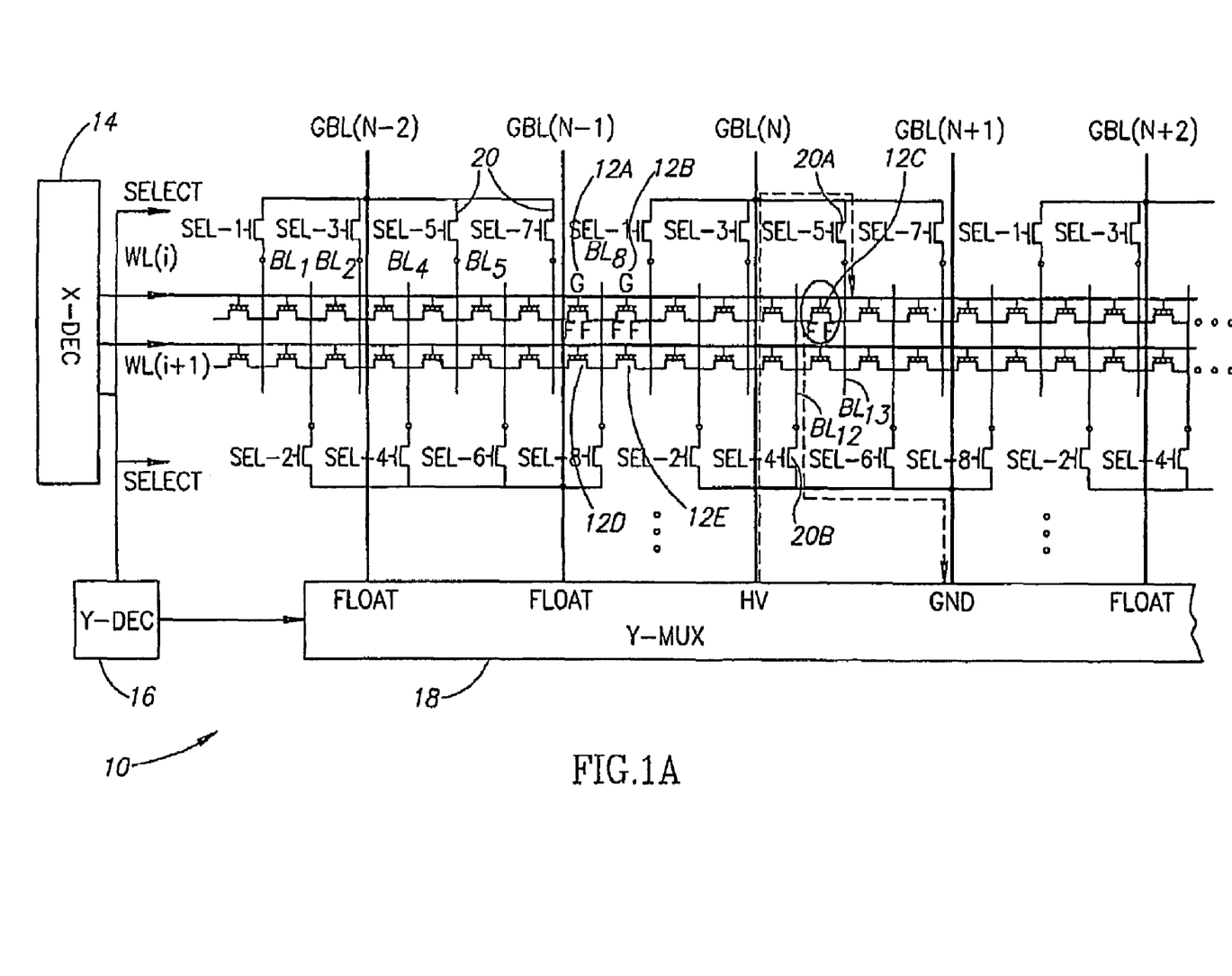
FIGS. 1A and 1B are schematic illustrations of two exemplary, prior art memory chips having memory arrays.
Figure 1B:
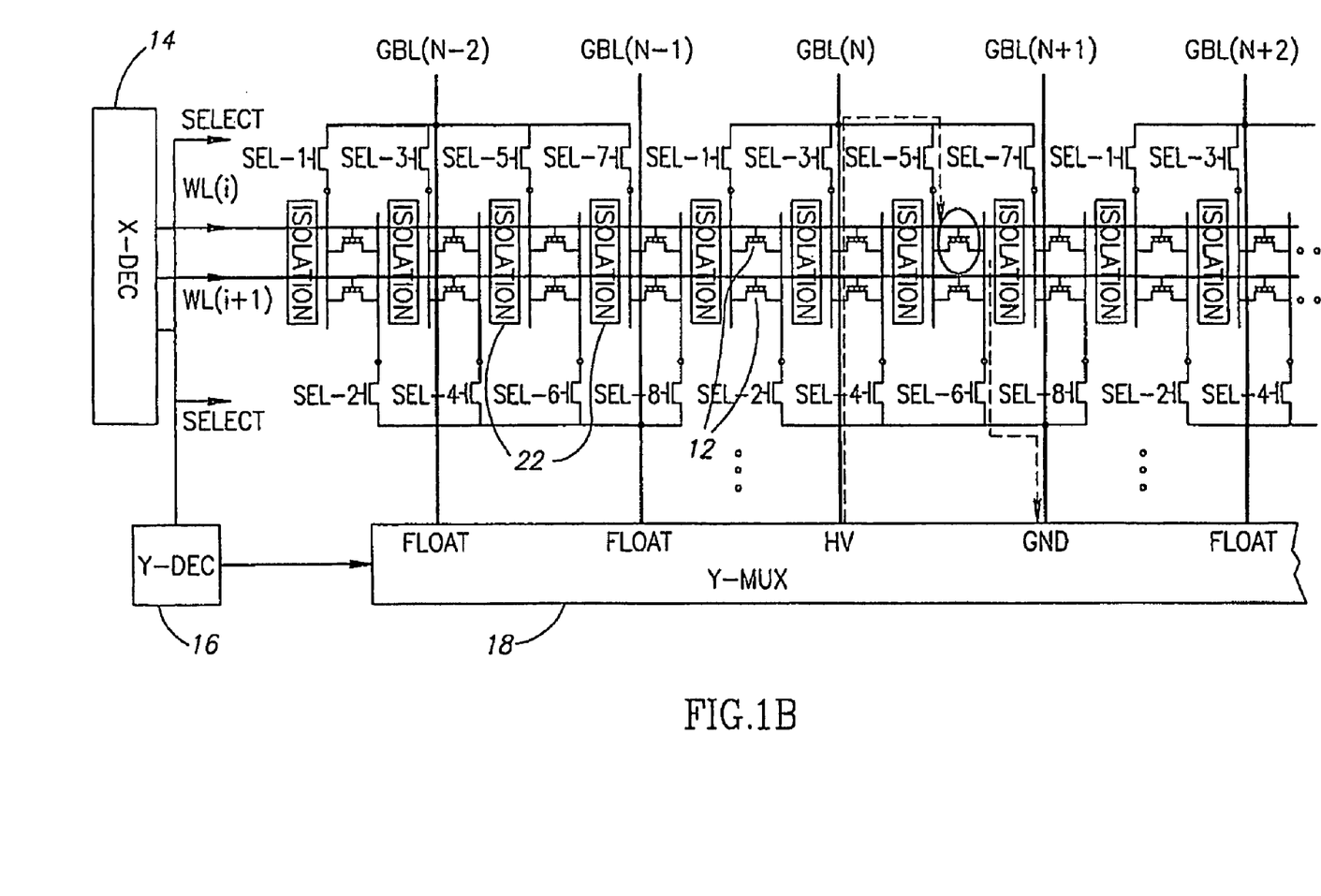

FIGS. 1A and 1B, to which reference is now made, illustrate two exemplary, prior art memory chips, which includes the array, labeled 10, of NROM cells 12, an X decoder 14, a Y decoder 16 and a Y multiplexer (Y-MUX) 18. The array of FIG. 1A is a segmented virtual ground array and is described in U.S. Pat. No. 6,633,496, assigned to the common assignee of the present invention and the array of FIG. 1B is based on the segmented array structure as described in U.S. Pat. No. 6,614,692, assigned to the common assignee of the present invention.

In both embodiments, array 10 comprises word lines WL(i) and local bit lines $BL_j$ to which the NROM cells 12 are connected and through which NROM cells 12 are accessed. Each NROM cell, such as cells 12A and 12B (FIG. 1A), comprises a gate terminal G, and two diffusions F acting as the source or drain of the cell. Each word line WL(i) connects together a row of NROM cells 12 by connecting their gates G together. Moreover, the diffusions F of each two neighboring cells of a row are connected together. Each local bit line $BL_j$ connects together two columns of NROM cells 12, connecting together their diffusions F. Thus, bit line $BL_8$ connects the diffusions F of cells 12A and 12B to the diffusions F of cells connected to other WL's but sharing the same column (like cells 12D and 12E). Array 10 also comprises global bit lines GBL(n) and select cells 20. Global bit lines GBL(n) are connected between Y-MUX 18 and select cells 20 and select cells 20 connect the global bit lines GBL(n) to local bit lines $BL_j$. In the embodiment of FIG. 1B, there are isolation areas 22 which electrically isolate one or more columns of cells 12 from its neighboring columns.

X decoder 14 activates a row of NROM cells 12 by activating an individual word line WL(i). Y decoder 16 decodes the Y address of a bit to be accessed and instructs Y-MUX 18 to select the global bit lines GBL(n) connectable to the local bit lines $BL_j$ of the cell housing the bit to be accessed. X decoder 14 also activates the SELECT lines associated with the select cells 20 needed to connect the selected global bit line GBL(n) to the desired local bit line $BL_j$.

For example, to program a bit, all the global bit lines GBL are initially discharged and floating. To program a bit in cell 12C, X decoder 14 may first activate word line WL(i), to activate the gate of cell 12C. As word line WL(i) rises to its programming voltage level, X-decoder 14 may select the bit line access path by activating select lines SEL-5 and SEL-4 to activate select cells 20A and 20B, respectively. Y-MUX 18 may drive GBL(N) and GBL(N+1) to GND and may leave all the other global bit lines floating.

Figure 2:
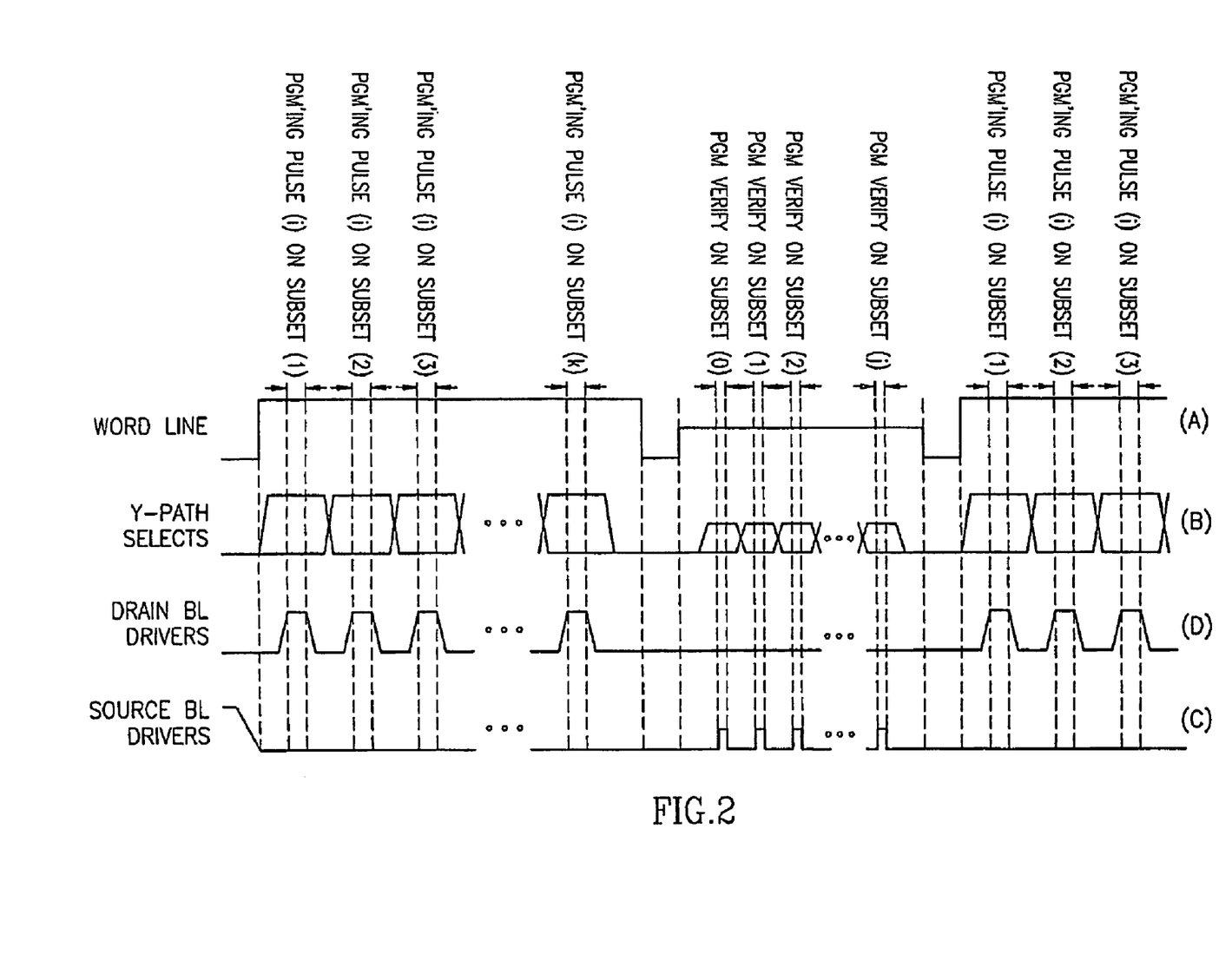
FIG. 2 is a timing diagram illustration of the activation timing for programming a multiplicity of cells in the arrays of FIGS. 1A and 1B.

In order to apply the programming pulse that will program the cell's bit (the right side charge storage area as in FIG. 1A or the left side storage area as in FIG. 1B), Y-MUX 18 drives global bit line GBL(N) to a high voltage (HV), about 4-6V, global bit line GBL(N+1) to GND (0V) or another close to GND potential, and all other global bit lines typically remain floating. Select cell 20A passes the high voltage of global bit line GBL(N) to local bit line $BL_{12}$ and thus, to the diffusion F acting as a source of cell 12C. Select cell 20B passes the ground voltage of global bit line GBL(N+1) to local bit line $BL_{13}$ and thus, to the diffusion F acting as the drain of cell 12C. The dotted line indicates the flow of current from Y-MUX 18, through cell 12C and back to Y-MUX 18. The programming pulse ends by driving global bit line GBL(N) low. Reference is now made to FIG. 2, which illustrates the activation timing for programming a multiplicity of cells. This programming method is discussed in US Publication 2003-0145176-A1, which application is co-owned by the common assignee of the present invention.

Initially (graph (a)), the selected word line WL(i) is driven to a high voltage (e.g. 9V). At about the same time, or shortly thereafter, the relevant select lines SEL-x are also activated (graph (b)) to define the conducting path to the cell to be accessed. In graph (c), a GND or close to GND potential is driven to the drain and source terminals of the NROM cell to be accessed. Finally, as shown in graph (d), a high voltage pulse is applied to the global bit line (GBL) to be connected to the cell's drain terminal, to provide a programming pulse. The programming pulse (PGM'ing Pulse) is followed by a program verify operation (PGM Verify) (which requires different voltage levels at the NROM cell terminals).

Figure 3:
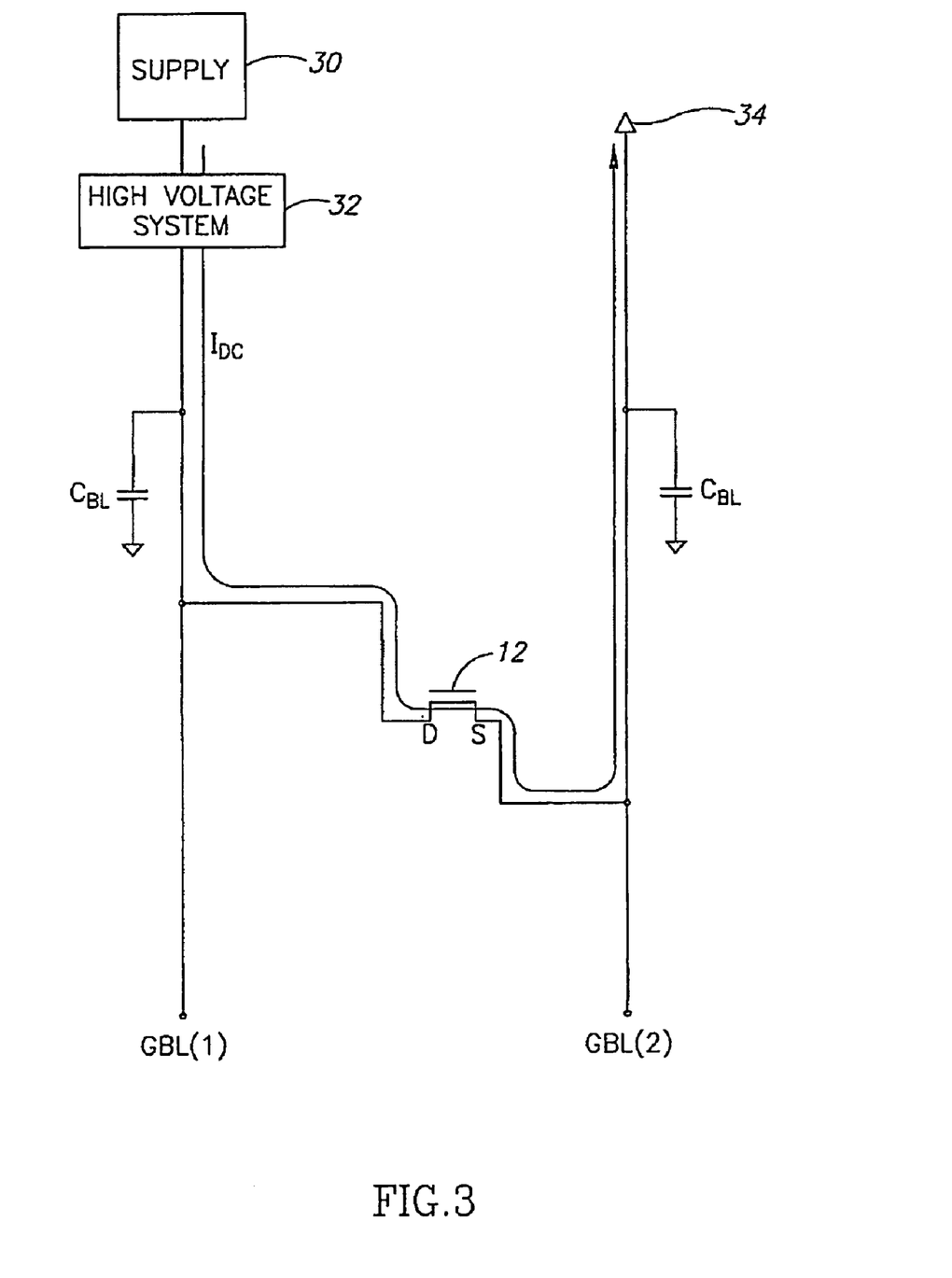
FIG. 3 is a schematic illustration of the flow of direct current $I_{DC}$ during a programming pulse in the arrays of FIGS. 1A and 1B.

When programming a large number of cells (e.g. in a 512 B page write operation), programming pulses may be applied to all the cells on the selected word line WL(i) to be programmed before applying the program verify test. This is shown in graphs (b) and (d) by the multiple transitions. Reference is now made to FIG. 3, which schematically illustrates the flow of direct current $I_{DC}$ during a programming pulse. DC current $I_{DC}$ flows from a power supply 30, through a high voltage supply system 32 (which may include charge pumps, regulators, or boosters), along a first, long global bit line GBL(1), through cell 12 to be programmed, along a second long global bit line GBL(2), until it reaches a ground supply 34. Along this current path there are usually additional conducting transistors (not shown in FIG. 3) which serve as switches. The high voltage supply system 32 generates programming voltage levels (HV) which are significantly higher than the voltage level of power supply 30 (Vcc). The power efficiency (η) of the high voltage supply system is typically low (less than 50%) and therefore the current consumed from the power supply 30 ($I_{CC,DC}$) is significantly larger than $I_{DC}$. Specifically, $$I_{CC,DC} = HV * I_{DC}/Vcc/\eta$$

The DC current $I_{DC}$ may be relatively large during programming, especially if many cells need to be programmed in parallel in order to achieve high programming rates. In addition, in the programming sequence shown in FIG. 2, each programming pulse charges and discharges the associated GBL. In high density memory devices, the parasitic capacitances $C_{BL}$ associated with the global bit lines may be relatively large. The larger the capacitance $C_{BL}$ is, the larger the dynamic current consumed from the high voltage supply system 32. In addition, in the sequence shown in FIG. 2, the capacitances $C_{BL}$ are charged and discharged many times during a programming operation. The dynamic current consumed from the high voltage supply system 32 is high, and the current consumed from the power supply 30 is even higher (due to the low efficiency of the high voltage supply system 32).

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The present invention may be novel programming methods which may reduce the amount of power required for programming NROM cells. One method may minimize the DC current components which flow from power supply 30 to GND 34. Another method may utilize transient currents to perform the programming operation. A third method may avoid or minimize the switching of parasitic capacitances $C_{BL}$.

Figure 4A:
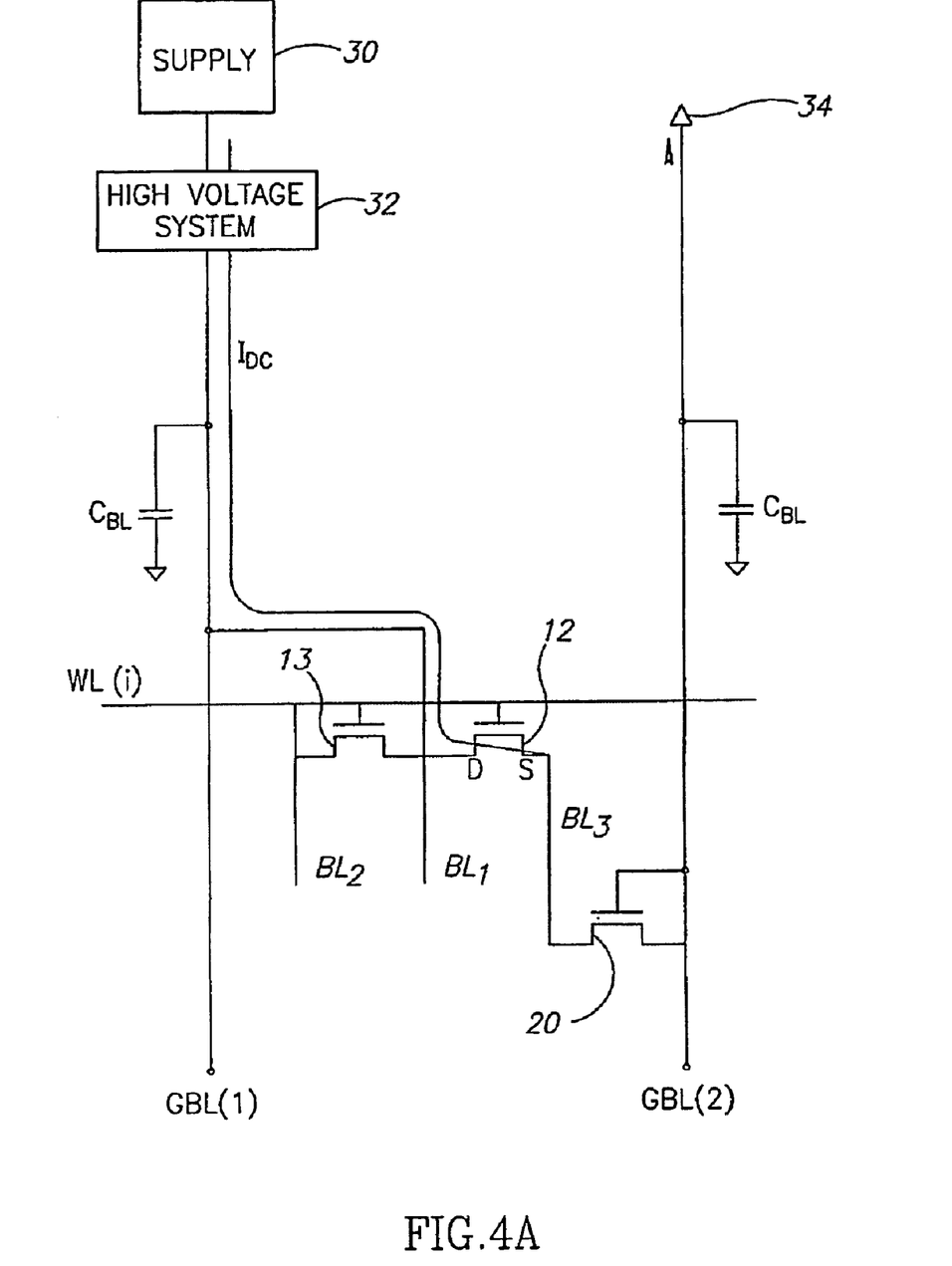
FIGS. 4A and 4B are schematic illustrations of the flow of current in one embodiment of the present invention.
Figure 4B:
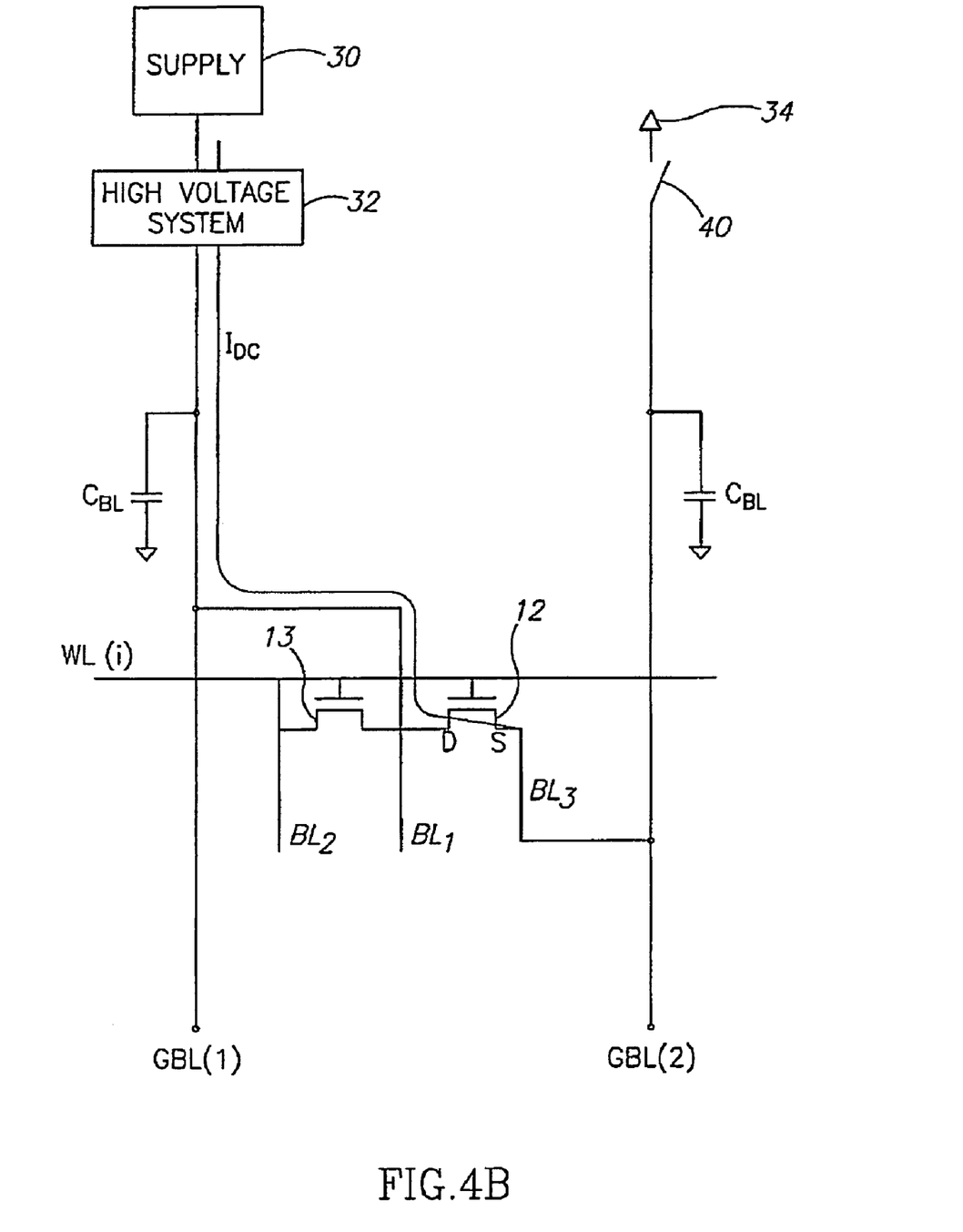

Reference is now made to FIGS. 4A and 4B, which schematically illustrate the flow of current in one embodiment of the present invention. In this embodiment, when the programming pulse may be applied, ground 34 may be disconnected from the global bit line, such as global bit line GBL(2), which may be connectable to the diffusion, labeled S, acting as the source terminal of cell 12 to be accessed. As a result, DC current $I_{DC}$ may not flow between pump 32 and ground GND 34.

In FIG. 4A, ground 34 may be disconnected by inactivating the select transistor 20 connecting the local bit line, here labeled $BL_3$, to global bit line GBL(2). Select transistor 20 is therefore shown with dashed lines. In FIG. 4B, ground 34 may be disconnected by disconnecting a switch 40 connecting ground supply 34 to global bit line GBL(2)

Despite the disconnection, cell 12 may still be successfully programmed. The global bit line, such as global bit line GBL(1), connectable to the diffusion, labeled D, acting as the drain terminal, may be driven to the high programming voltage (such as 4-6V). The remaining global bit lines (not shown) in the array may remain floating.

Since word line WL(i) may have been driven high, as GBL(1) may be driven high, current may start flowing through to drain terminal D of cell 12. The bit on the drain side of the cell may start to program and current may begin to flow through cell 12. However, since global bit line GBL(2) may not be grounded, the voltage on the source side local bit line (marked $BL_3$) may start to rise. This is shown in FIG. 5, to which reference is now briefly made.

Figure 5:
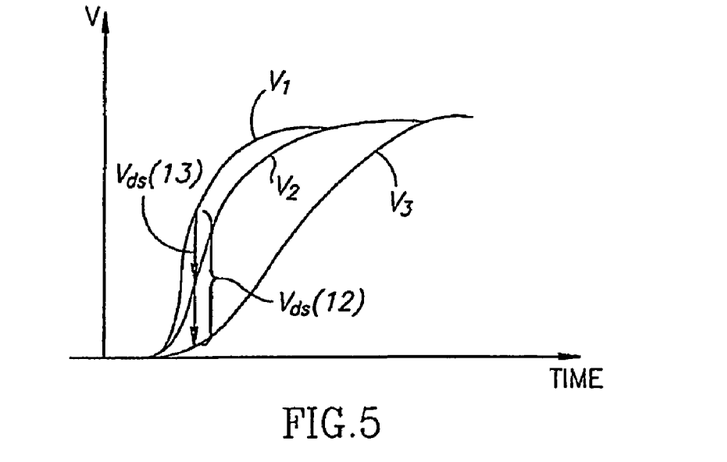
FIG. 5 is a graphical illustration of the voltages over time on three local bit lines, useful in understanding the operation of the embodiment of FIGS. 4A and 4B.

FIG. 5 graphs the voltages over time on three local bit lines, the drain side local bit line $BL_1$, the source side local bit line $BL_2$ for the neighboring cell, labeled 13, and the source side local bit line $BL_3$ for cell 12. As can be seen, the voltage $V_1$ on the drain side local bit $BL_1$ rises quickly and sharply. The voltage $V_2$ on the source side local bit line $BL_2$ for neighboring cell 13 rises quickly but not as sharply since bit line $BL_2$ was not initially grounded (it was floating). The voltage $V_3$ on source side local bit line $BL_3$ for cell 12 rises the slowest as it starts from a ground voltage. The result is that the drain to source voltage $V_{ds}$ for cell 12 may be sufficiently large to program. It should not be sufficiently large to program cell 13. However, as voltage $V_3$ may rise, the programming rate of cell 12 may decrease (due to the lowering $V_{ds}$) and its body effect may increase. The result is a reduced cell current. As long as the drain to source voltage $V_{ds}$ is sufficiently high for long enough, as illustrated in FIG. 6 to which reference is now briefly made, the bit may be programmed.

Figure 6:
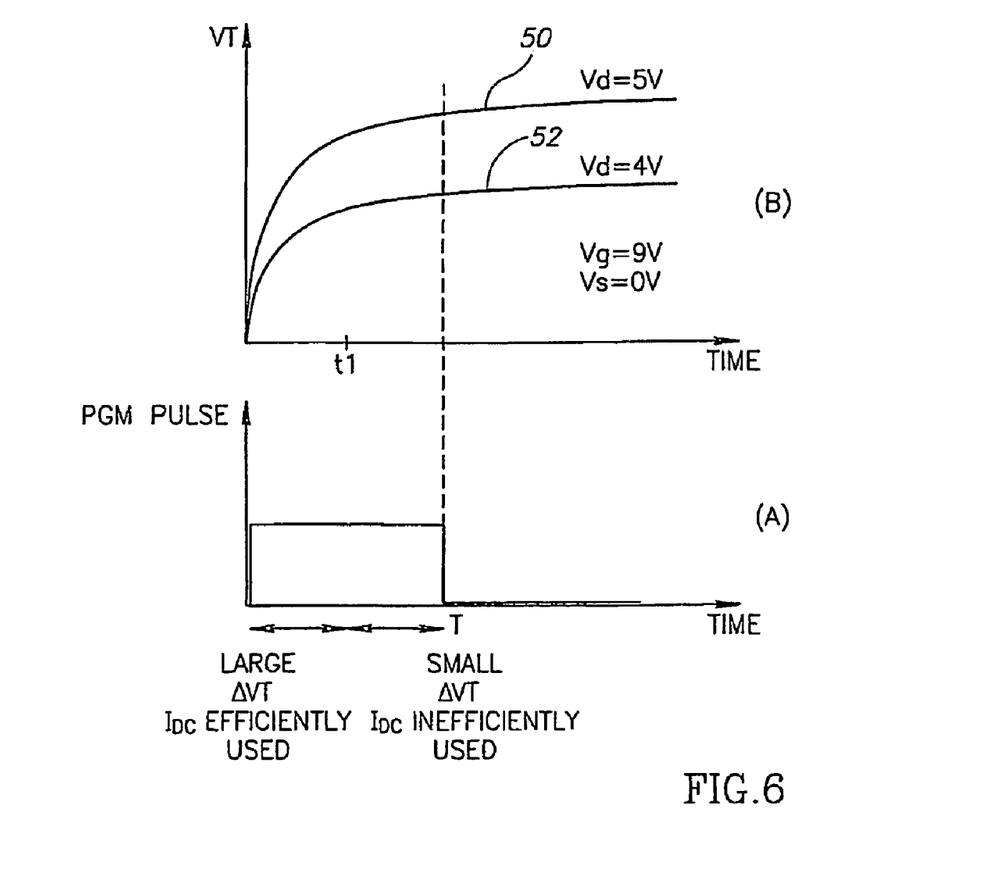
FIG. 6 is a graphical illustration of the changes in a threshold voltage $V_t$ over time in the presence of two different operating conditions, useful in understanding the operation of the embodiment of FIGS. 4A and 4B.

FIG. 6 graphs a program pulse (graph (a)) and the changes in a threshold voltage $V_t$ (which defines the programmed state of a bit) over time in the presence of two different operating conditions (graph (b)). The program pulse may last until a time T.

Curve 50 graphs the changes for the following operating conditions (gate voltage $V_g$=9V, drain voltage $V_d$=5V, source voltage=0V) and curve 52 graphs the changes for the following operating conditions (gate and drain voltages as in curve 50, drain voltage $V_d$=4V).

As can be seen, the threshold voltage $V_t$ initially increases at a fast rate, during which the programming (direct) current $I_{DC}$ may be relatively efficiently used, and then (at about time t1 in FIG. 6), it saturates with a very small rate of increase afterwards, during which the programming (direct) current $I_{DC}$ may not be efficiently used. In the embodiment of the present invention, as long as $V_{ds}$ remains large enough for a sufficient amount of time such that the threshold voltage $V_t$ reaches the saturation region, then the bit will be programmed with a minimal amount of current applied.

It will be appreciated that the time t1 may vary due to the operating conditions (e.g. temperature) and the programming state of the cell (i.e. how many times the two bits of the cell have been programmed).

It will further be appreciated that, in order to prevent the source voltage $V_s$ from rising too fast (resulting in a non-effective programming pulse), the source side BL capacitance should not be too small. One way to ensure that is to leave the now floating global bit line GBL(2) connected to the source side bit line $BL_3$, as shown in FIG. 4B.

The programming pulse may be ended by discharging global bit lines GBL(1) and GBL(2) to GND, or by discharging the WL, or by de-selecting the accessed cell.

Figure 7A:
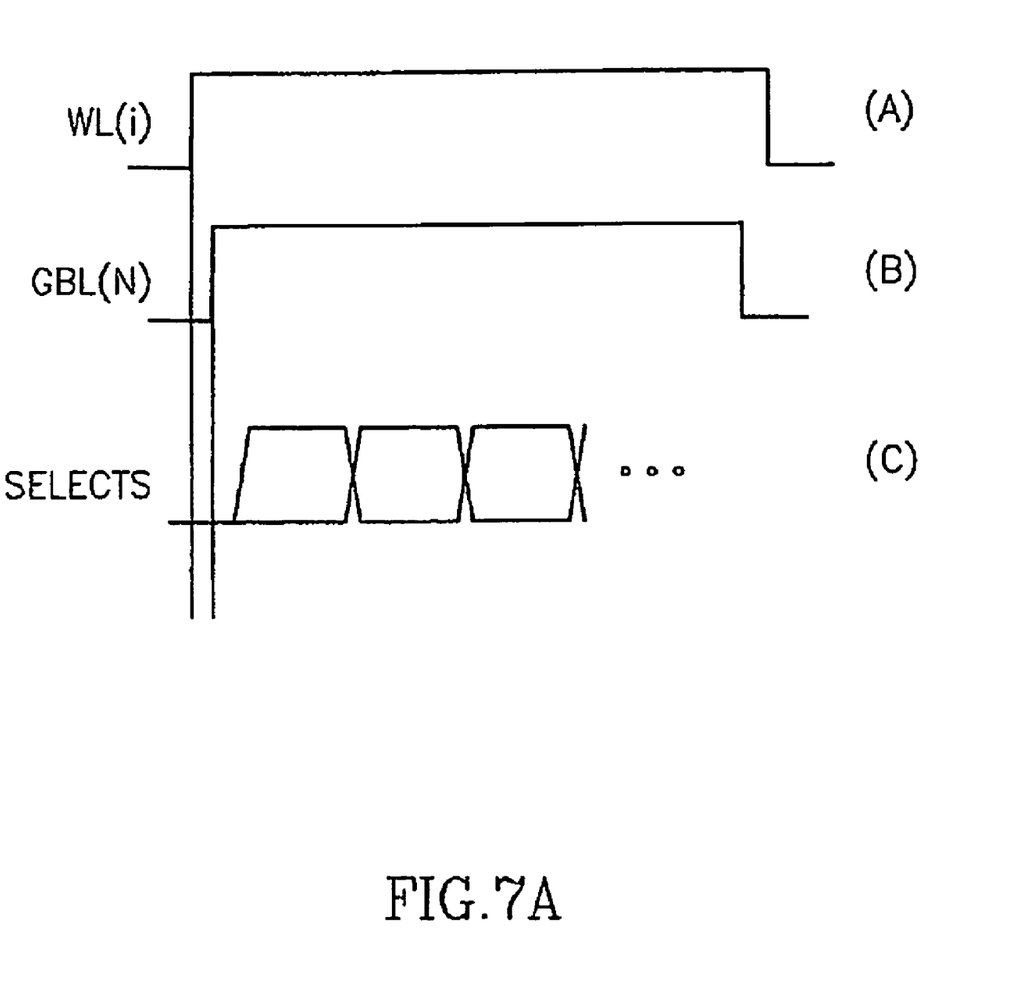
FIG. 7A is a timing diagram illustration of a second embodiment of the present invention.
Figure 7B:
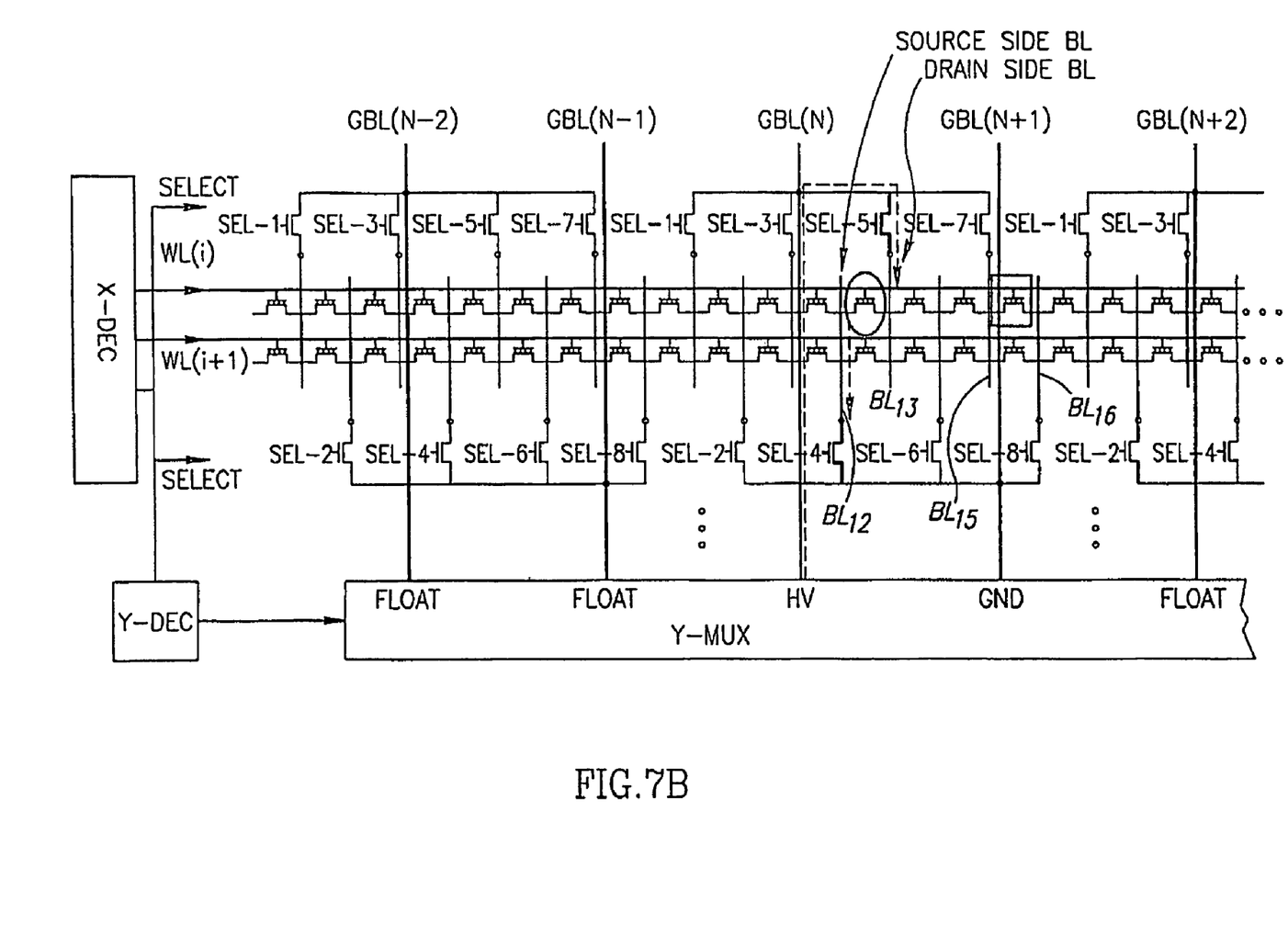
FIG. 7B is a schematic illustration of the array of FIG. 1A when using the timing diagram of FIG. 7A.

Reference is now made to FIGS. 7A and 7B, which together illustrate a second preferred embodiment of the present invention. In this embodiment, the current consumption may be minimized by reducing the number of charge and discharge events of a global bit line GBL driven to high programming voltage. Once a global bit line GBL may be driven to high voltage, insertion of this high voltage into a local bit line $BL_j$ may be controlled by select transistors 20. FIG. 7A is a timing diagram for this embodiment and FIG. 7B is the array of FIG. 1A operated in accordance with this embodiment. It will be appreciated that the present invention includes operating the array of FIG. 1B and other similar arrays in accordance with this embodiment. Initially, the selected word line WL (graph (a)) is driven high, after which, in accordance with a preferred embodiment of the present invention, the selected global bit line (graph (b)), such as GBL(N) of FIG. 7B, may be driven high. The global bit line connectable to the source side bit line, such as global bit line GBL(N+1), may be left floating or may be driven to GND.

Once both the word line WL(i) and the global bit line GBL(N) connectable to the drain bit line have been driven to their programming levels, the relevant select transistors which insert the power to the drain side bit lines may be activated (graph (c)). Thus, in FIG. 7B, select transistor SEL5 may be turned ON for the required programming pulse duration, thereby providing power to bit line $BL_{13}$ and programming the drain side bit of the circled cell until select transistor SEL5 may be turned OFF.

Global bit line GBL(N) may then remain at high voltage but may not drive any more current to a cell. The drain side bit line $BL_{13}$ will quickly drop to a voltage low enough to end the programming operation. Global bit line GBL(N+1), which may be connectable to the source side bit line $BL_{12}$, may be driven to GND, causing the local bit lines adjacent to the circled cell to discharge to GND after select transistor SEL5 may be turned OFF.

In this embodiment, the next bits to be programmed may be the ones in the same row as the circled cell (i.e. having the same word line WL(i)) that uses global bit line GBL(N) as its high voltage global bit line. For example, the square cell of FIG. 7B.

To access the square cell and program its left side bit, select transistor SEL8 may be turned ON to connect the source side, local bit line $BL_{16}$ to GBL(N+1), and select transistor SEL7 may be turned ON to supply the high voltage to the drain bit of the square cell and to start its programming pulse. The programming pulse may substantially end when select transistor SEL7 is turned OFF. Again, discharge of the local bit lines may be performed at the end of the programming pulse.

This procedure may continue until all the bits that require programming and use the already charged global bit line GBL(N) as their high voltage global bit line have received a programming pulse.

When more than a single bit is accessed in parallel, such as in the case of a full word access, they typically share the same WL and are located far away from each other. In this case, the programming may be defined by the data of the word and only some of the bits may need to be applied with a programming pulse. For the bits not to be programmed, the programming pulse may be prevented by either discharging the global bit line GBL(N) connected to the not-to-be-programmed bit or by using different signals to control the SELECT transistors and prevent the programming voltage HV from being inserted into the drain local bit line BL of the cell that does not need to be programmed.

Figure 8A:
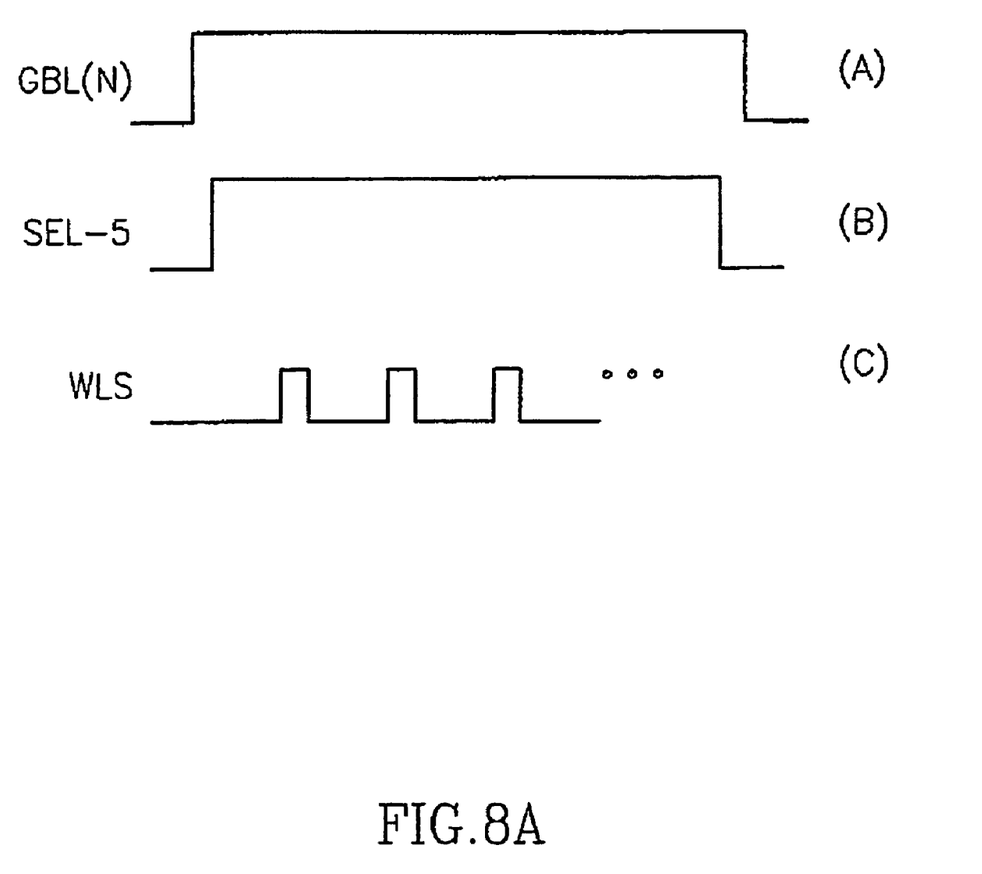
FIG. 8A is a timing diagram illustration of a third embodiment of the present invention.
Figure 8B:
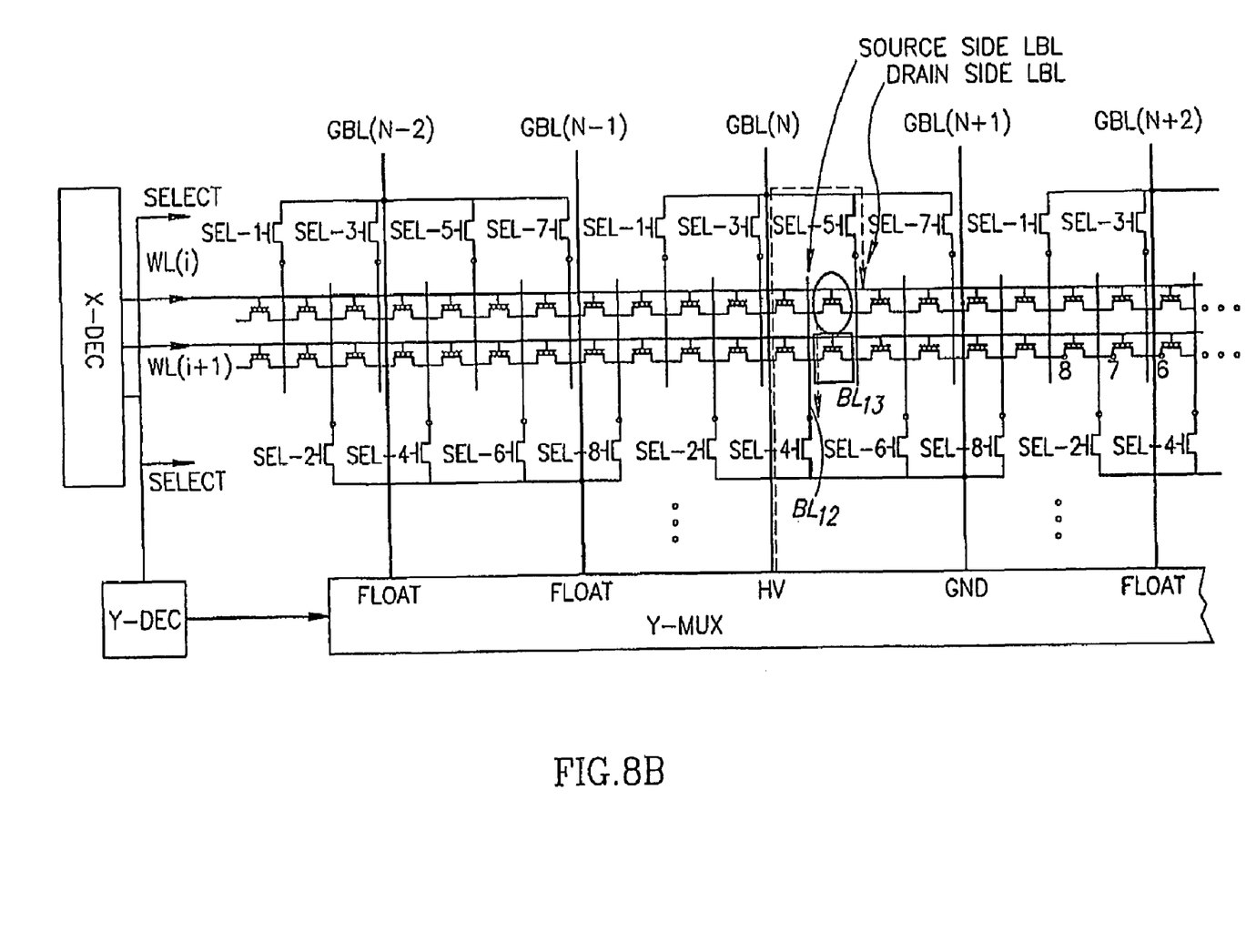
FIG. 8B is a schematic illustration of the array of FIG. 1A when using the timing diagram of FIG. 8A.

Reference is now made to FIGS. 8A and 8B, which together illustrate a third preferred embodiment of the present invention. FIG. 8A is a timing diagram for this embodiment and FIG. 8B is the array of FIG. 1A operated in accordance with this embodiment. It will be appreciated that the present invention includes operating the array of FIG. 1B and other similar arrays in accordance with this embodiment.

In this embodiment, a column or portion of a column of bits are programmed one after the other, by selectively activating word lines WL and without charging or discharging the local bit line BL and the global bit line GBL connected to it.

As an example, in order to program the cells marked with a circle and a square in FIG. 8B, GBL(N) may first be driven high (graph (a) of FIG. 8A), after which it may be connected (graph (b)), through select transistors SEL-5 to the drain side local bit line $BL_{13}$ of those cells. The source side local bit line $BL_{12}$ connected to GBL(N+1) may be driven to GND or left floating. With the programming voltage at the cell, word line WL(i) may be driven to its programming level. The circled cell may start programming. The square cell will not program since its word line WL(i+1) is low. The programming pulse may be ended by driving word line WL(i) low (typically to GND or to a close to GND level).

The next programming pulse may be provided by driving word line WL(i+1) to its programming level. This may cause the square cell to start programming. Its programming may be ended by driving word line WL(i+1) low. Once all of the bits in the column have finished programming, select transistor SEL-5 may be deactivated and global bit line GBL(N) may be driven low.

When more than a single bit is accessed in parallel, such as in the case of a full word access, the programming may be defined by the data of the word and only some of the bits may need to be applied with a programming pulse. For the bits not to be programmed the programming pulse may be prevented by either discharging the global bit line GBL connected to the not-to-be-programmed bit, by using different signals to control the SELECT transistors and prevent the programming voltage HV from being inserted to the drain local bit line BL of the cell that does not need to be programmed, by segmenting the word line WL and using different control signals for the different word line WL segments.

It will be appreciated that, in the embodiments hereinabove, the source side local bit line may be left floating after being discharged, and programming may be "unforced" as in the first embodiment. That is, there may be initial conditions setting up programming but there may be little or nothing to maintain the programming conditions. Programming may stop being efficient when the cell no longer has effective programming conditions therein. The select transistor may disconnect the charged GBL afterwards.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method of programming a non-volatile memory cell comprising: applying only a substantially transient current to a source or drain terminal of the cell; wherein applying only a substantially transient current comprises providing a programming voltage to a source or drain of said cell; and after said source or drain voltage is applied, disconnecting a second terminal of the non-volatile memory cell from a ground voltage.

2. The method of claim 1 wherein said non-volatile memory cells are NROM cells.

3. The method of claim 1 wherein said non-volatile memory cells are arranged in a segmented virtual ground array configuration.

4. A non-volatile memory ("NVM") device comprising: an NVM array including a set of NVM cells; a power supply circuit portion for providing current at one or more voltages; a switching circuit adapted to regulate electrical paths between NVM cells within said array and said power supply circuit; and control logic adapted to cause said switching circuit to provide substantially transient current flow from said power supply circuit to one or more NVM cells in said array during programming.

5. The device according to claim 4, wherein said control logic is adapted to cause said switching circuit to disconnect a source of each of the one or more NVM cells from a ground voltage and to cause said power supply circuit to provide a programming voltage to a drain of each of the one or more cells during programming.

6. The device according to claim 5, wherein disconnecting comprises disconnecting a ground supply from a global bit line.

7. The device according to claim 5, wherein disconnecting comprises disconnecting a local bit line forming said source from a global bit line carrying said ground voltage.

8. The device of claim 4, wherein said control logic is adapted to cause a programming voltage to be applied to a drain of each of the one or more NVM cells and then to disconnect a source of the one or more NVM cells from a ground voltage.

9. The device according to claim 8, wherein disconnecting comprises disconnecting a ground supply from a global bit line.

10. The device according to claim 8, wherein disconnecting comprises disconnecting a local bit line forming said source from a global bit line carrying said ground voltage.

11. A non-volatile memory ("NVM") cell programming circuit comprising: a power supply circuit portion for providing current at one or more voltages; a programming circuit portion adapted to apply substantially transient current flow from said power supply circuit to one or more NVM cells during programming, and wherein said programming circuit portion is adapted to disconnect a source of each of the one or more NVM cells from a ground voltage and to provide a programming voltage to a drain of each of the one or more cells during programming.

12. The circuit according to claim 11, wherein disconnecting comprises disconnecting a ground supply from a global bit line.

13. The circuit according to claim 11, wherein disconnecting comprises disconnecting a local bit line forming said source from a global bit line carrying said ground voltage.

14. A non-volatile memory ("NVM") cell programming circuit comprising: a power supply circuit portion for providing current at one or more voltages; a programming circuit portion adapted to apply substantially transient current flow from said power supply circuit to one or more NVM cells during programming; and wherein said programming circuit portion is adapted to provide a programming voltage to a drain of each of the one or more NVM cells and then to disconnect a source each of the one or more NVM cells from a ground voltage.

15. The circuit according to claim 14, wherein disconnecting comprises disconnecting a ground supply from a global bit line.

16. The circuit according to claim 14, wherein disconnecting comprises disconnecting a local bit line forming said source from a global bit line carrying said ground voltage.

17. The circuit according to claim 11, wherein the one or more NVM cells are charge trapping type NVM cells.

18. The circuit according to claim 11, wherein the one or more NVM cells are part of an NVM memory array.

19. The circuit according to claim 18, wherein the one or more NVM cells are part of a segmented virtual ground array.

20. The circuit according to claim 14, wherein the one or more NVM cells are charge trapping type NVM cells.

21. The circuit according to claim 14, wherein the one or more NVM cells are part of an NVM memory array.

22. The circuit according to claim 21, wherein the one or more NVM cells are part of a segmented virtual ground array.

* * * * *